United States Patent
Kwon et al.

(10) Patent No.: US 8,174,906 B2
(45) Date of Patent: May 8, 2012

(54) NONVOLATILE MEMORY DEVICE, PROGRAM METHOD AND PRECHARGE VOLTAGE BOOSTING METHOD THEREOF, AND MEMORY SYSTEM INCLUDING THE NONVOLATILE MEMORY DEVICE

(75) Inventors: Ohsuk Kwon, Yongin-si (KR); Kihwan Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 207 days.

(21) Appl. No.: 12/587,803

(22) Filed: Oct. 13, 2009

(65) Prior Publication Data

US 2010/0091576 A1     Apr. 15, 2010

(30) Foreign Application Priority Data

Oct. 13, 2008   (KR) .................. 10-2008-0099942

(51) Int. Cl.
*G11C 7/10*     (2006.01)
(52) U.S. Cl. ................................. 365/189.05
(58) Field of Classification Search ............ 365/185.25, 365/185.12, 189.05
See application file for complete search history.

(56) References Cited

U.S. PATENT DOCUMENTS

| | | | |
|---|---|---|---|
| 6,005,802 A | 12/1999 | Takeuchi et al. | |
| 6,072,719 A * | 6/2000 | Tanzawa et al. | 365/185.03 |
| 6,353,555 B1 * | 3/2002 | Jeong | 365/185.11 |
| 6,650,566 B2 | 11/2003 | Jeong et al. | |
| 7,064,980 B2 | 6/2006 | Cernea et al. | |
| 7,269,069 B2 | 9/2007 | Cernea et al. | |
| 2002/0071311 A1 | 6/2002 | Jeong et al. | |
| 2005/0029051 A1 * | 2/2005 | Hosono et al. | 185/17 |
| 2005/0057965 A1 | 3/2005 | Cernea et al. | |
| 2006/0227614 A1 | 10/2006 | Cernea et al. | |
| 2008/0151633 A1 * | 6/2008 | Park et al. | 365/185.19 |

FOREIGN PATENT DOCUMENTS

| | | |
|---|---|---|
| JP | 11-120779 A | 4/1999 |
| JP | 2002-203393 A | 7/2002 |
| JP | 2007-506221 A | 3/2007 |
| KR | 10-0385224 B1 | 5/2003 |
| KR | 10-2006-0067970 A | 6/2006 |
| WO | 2005/029502 A1 | 3/2005 |

* cited by examiner

*Primary Examiner* — Anh Phung
*Assistant Examiner* — Khamdan Alrobaie
(74) *Attorney, Agent, or Firm* — Onello & Mello, LLP

(57) ABSTRACT

A method of programming a nonvolatile memory device according to the present invention includes precharging bit lines according to data loaded in page buffers; electrically connecting the precharged bit lines to channels corresponding to the bit lines, respectively, to charge the channels; and applying a word line voltage for a program after charging the channels. A channel voltage boosting of each of the channels is determined according to data loaded in adjacent page buffers.

18 Claims, 10 Drawing Sheets

NONVOLATILE MEMORY DEVICE, PROGRAM METHOD AND PRECHARGE VOLTAGE BOOSTING METHOD THEREOF, AND MEMORY SYSTEM INCLUDING THE NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2008-0099942, filed in the Korean Intellectual Property Office on Oct. 13, 2008, the entire contents of which are herein incorporated by reference.

BACKGROUND

The exemplary embodiments described herein relate to nonvolatile memory devices, program methods and precharge voltage boosting methods thereof, and memory systems including the nonvolatile memory devices.

Nonvolatile memory devices retain their stored data even when their power supply voltages are interrupted. Flash memories are a type of nonvolatile memory device. Since flash memories can electrically erase multiple stored data at the same time, they are widely used in computers and memory cards.

Flash memories are classified into NOR-type flash memories and NAND-type flash memories according to a configuration of connections between bit lines and memory cells. Since NOR-type flash memories have large current consumption, they have a disadvantage in high integration. However, the NOR-type flash memories have the advantage of high speed. Since NAND-type flash memories consume a small cell current compared with NOR-type flash memories, they have an advantage in high integration.

SUMMARY

According to a first aspect, the present invention provides a method of programming a nonvolatile memory device. The method may include precharging bit lines according to data loaded in page buffers; charging channels by electrically connecting the precharged bit lines to the channels corresponding to the bit lines, respectively; and applying a word line voltage for a program after charging the channels. A channel voltage boosting of each of the channels is determined according to data loaded in adjacent page buffers.

In one embodiment, when different data are respectively loaded in a first page buffer and a second page buffer adjacent to each other among the page buffers, an increased precharge voltage is applied to one of a first bit line corresponding to the first page buffer and a second bit line corresponding to the second page buffer. In one embodiment, when data '1' is loaded in the first page buffer and data '0' is loaded in the second page buffer, the increased precharge voltage is applied to the first bit line. In one embodiment, the increased precharge voltage is a power supply voltage or a voltage higher than the power supply voltage. In one embodiment, the increased precharge voltage is generated from a high voltage generator and the generated increased precharge voltage is directly applied to the first bit line. In one embodiment, the increased precharge voltage is obtained from a boosting using a coupling between the first bit line and the second bit line. In one embodiment, a precharge voltage is applied to the first bit line, the first bit line of the precharge voltage is floated for a predetermined time and the precharge voltage is applied to the second bit line for the predetermined time so as to obtain the increased precharge voltage.

In one embodiment, applying the word line voltage includes applying a pass voltage to unselected word lines and applying a program voltage to a selected word line.

According to another aspect, the present invention provides a method of boosting a channel precharge voltage of a nonvolatile memory device. The method may include applying a precharge voltage to a first bit line; floating the first bit line of the precharge voltage; boosting the precharge voltage of the first bit line by applying the precharge voltage to a second bit line adjacent to the first bit line when the first bit line is in a floating state; and applying the boosted precharged voltage to a channel by electrically connecting the first bit line to a channel corresponding to the first bit line.

In one embodiment, when a program operation is performed, the first bit line is connected to a program inhibited cell and the second bit line is connected to a program cell.

According to another aspect, the present invention provides a nonvolatile memory device. The nonvolatile memory device may include a memory cell array including a plurality of memory cells disposed in regions where a plurality of word lines crosses a plurality of bit lines; a plurality of page buffers temporarily storing data to be programmed to the memory cell array or temporarily storing data read from the memory cell array; and a bit line select circuit electrically connecting the plurality of bit lines to the plurality of page buffers, respectively. Whether a precharge voltage of a bit line corresponding to a page buffer is increased is determined depending on a state of data loaded in an adjacent page buffer during a bit line setup period in a program operation.

In one embodiment, each of the plurality of page buffers determines whether the precharge voltage is increased according to a state of data loaded in an adjacent page buffer. In one embodiment, the bit line select circuit comprises a plurality of bit line select transistors having a drain connected to a bit line, a source connected to a page buffer and a gate receiving a bit line control signal, the bit line control signal being generated from the page buffer according to a state of data loaded in the adjacent page buffer. In one embodiment, when different data are respectively loaded in a first page buffer and a second page buffer adjacent to each other among the plurality of page buffers, the first page buffer controls such that a first bit line corresponding to the first page buffer has a precharge voltage of a floating state in a bit line setup period for a predetermined time and the second page buffer controls such that a precharge voltage is applied to a second bit line for the predetermined time when the first bit line becomes a floating state. In one embodiment, the second page buffer controls so that 0V is applied to the second bit line after a precharge voltage is applied to the second bit line for the predetermined time.

In one embodiment, the nonvolatile memory device further comprises a control logic controlling such that an even bit line set up operation is performed on even-number bit lines among the plurality of bit lines after performing an odd bit line set up operation on odd-number bit lines among the plurality of bit lines. In one embodiment, the control logic determines whether a precharge voltage of a bit line is increased according to a state of data loaded in adjacent page buffers when the odd bit line set up operation or the even bit line set up operation is performed.

In one embodiment, the control logic controls such that an increased precharge voltage is applied to a bit line corresponding to a page buffer in which data '1' is loaded when the odd bit line set up operation and the even bit line set up operation are performed and data '0' is loaded in a page buffer adjacent to the page buffer. In one embodiment, the nonvolatile memory device further comprises a high voltage generator applying the increased precharge voltage to the first bit line corresponding to the page buffer.

According to another aspect, the present invention provides a memory system. The memory system may include a nonvolatile memory device; and a memory controller controlling the nonvolatile memory device. The nonvolatile memory device precharges bit lines according to data loaded in page buffers, charges channels by electrically connecting the precharged bit lines to the channels corresponding to the respective bit lines and applies a word line voltage for a program after charging the channels. A channel voltage boosting of each of the channels is determined according to data loaded in adjacent page buffers.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this description will be thorough and complete, and will fully convey the present invention to those skilled in the art. Like numbers refer to like elements throughout.

A nonvolatile memory device according to the present invention determines whether or not a channel boosting is performed, depending on a state of data loaded in an adjacent page buffer in a bit line setup period. Thus, channel boosting efficiency is increased and as a result, an effect of a program disturbance is reduced.

Figure 1:
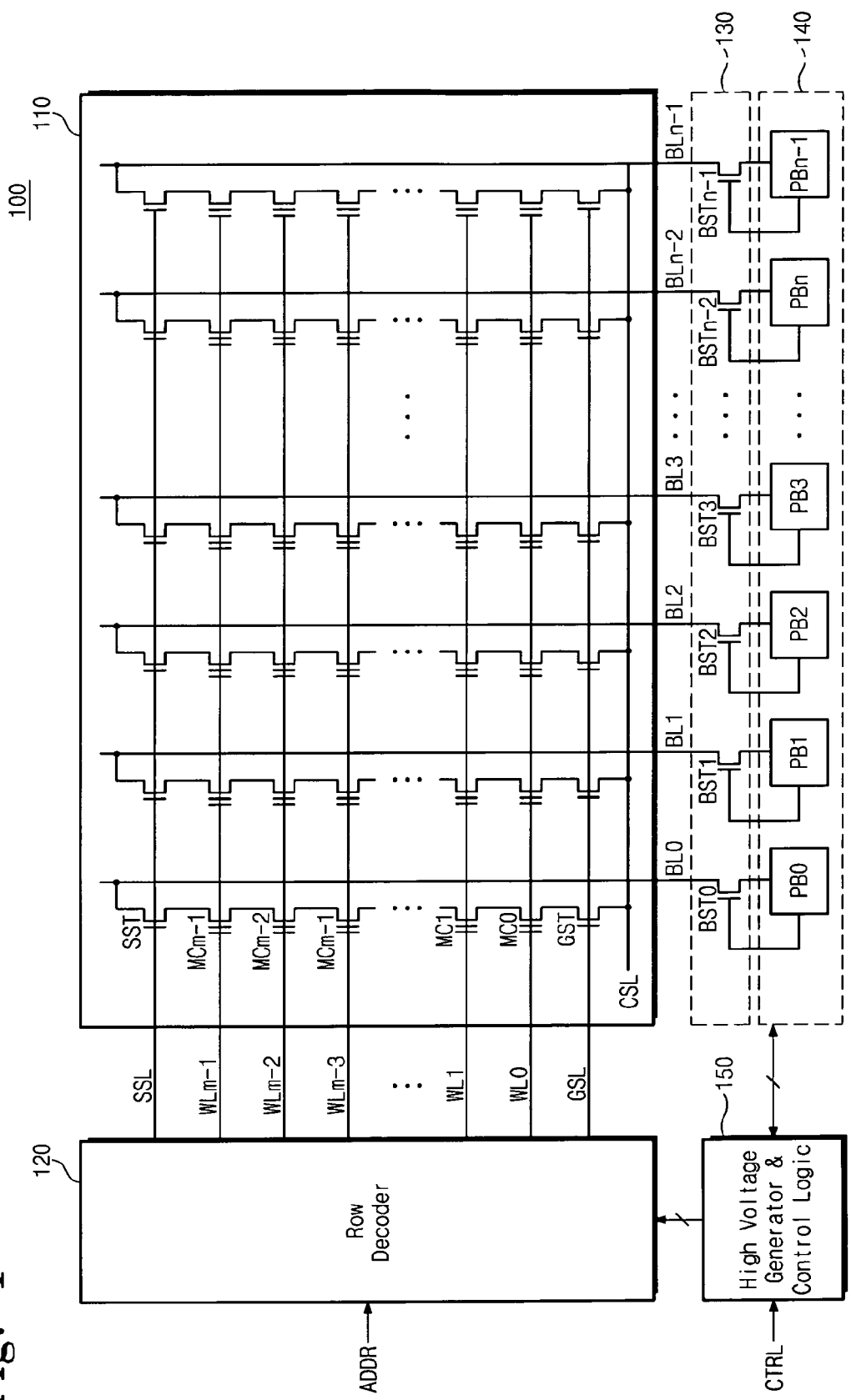
FIG. 1 is a drawing illustrating a first embodiment of a nonvolatile memory device according to the present invention.

FIG. 1 is a drawing illustrating a first embodiment of a nonvolatile memory device 100 according to the present invention. Referring to FIG. 1, the nonvolatile memory device 100 of the present invention includes a memory cell array 110, a row decoder 120, a bit line select circuit 130, a page buffer circuit 140 and a high voltage generator and control logic 150. The page buffer circuit 140 includes page buffers (PB0~PBn-1), which determine whether or not a precharge voltage is increased, depending on data loaded in an adjacent page buffer when a program operation is performed.

The nonvolatile memory device 100 depicted in FIG. 1 is a NAND-type flash memory. However, it is not necessary that the nonvolatile memory device of the present invention be limited to a NAND-type flash memory. The nonvolatile memory device of the present invention is able to be applied to various kinds of nonvolatile memories such as a NOR-type flash memory device, MRAM, PRAM, FRAM or the like. Also, the nonvolatile memory device of the present invention may be configured as a three-dimensional array structure.

The memory cell array 110 includes a plurality of memory cells disposed at a region at which a plurality of bit lines (BL0~BLn-1) and a plurality of word lines (WL0~WLm-1) cross one another. Here, multi-bit data may be stored in each of the memory cells. The memory cell array 110 is comprised of a plurality of memory blocks. Only one memory block is depicted in FIG. 1. Each memory block of the memory cell array 110 includes a plurality of cell strings. Each string, as shown in FIG. 1, includes a string select transistor (SST), a ground select transistor (GST) and m memory cells (MC0~MCm-1) serially connected between the string select transistor (SST) and the ground select transistor (GST).

A drain of the string select transistor (SST) of each string is connected to a corresponding bit line and a source of the ground select transistor (GST) is connected to a common source line (CSL). A plurality of word lines (WL0~WLm-1) crossing the strings is arranged such that the word lines (WL0~WLm-1) are connected to corresponding memory cells (MC0~MCm-1) of each string respectively. Data can be programmed into selected memory cells by applying a program voltage to a selected word line. Data can be read from selected memory cells by applying a read voltage to a selected word line. The bit lines (BL0~BLn-1) are electrically connected to the page buffers (PB0~PBn-1) of the page buffer circuit 140.

The row decoder 120 selects a memory block according to an input address (ADDR) and selects a word line to be driven in the selected memory block. For example, the row decoder 120 decodes an address (ADDR) inputted during a program operation to select a word line to be driven in the selected memory block. Here, a program voltage generated from the high voltage generator 150 is applied to the selected word line.

The bit line select circuit 130 includes a plurality of bit line select transistors (BST0~BSTn-1) connecting the plurality of bit lines (BL0~BLn-1) to the plurality of page buffers (PB0~PBn-1), respectively. Here, the bit line select transistors (BST0~BSTn-1) are turned on/off by the page buffers (PB0~PBn-1), respectively.

The page buffer circuit 140 includes the plurality of page buffers (PB0~PBn-1) which temporarily store data loaded in the memory cell array 110 during a program operation or temporarily store data read from the memory cell array 110 during a read operation. Respective page buffers (PB0~PBn-1) are connected to the memory cell array 110 through corresponding bit lines (BL0~BLn-1).

The page buffers (PB0~PBn-1) apply a ground voltage (for example, 0V) or a power supply voltage (Vcc) to a bit line according to data loaded during a program operation. For example, a ground voltage (0V) is applied to a bit line connected to a page buffer in which '0' data is loaded (i.e., a bit line connected to a program cell). A power supply voltage (Vcc) is applied to a bit line connected to a page buffer in which '1' data is loaded (i.e., a bit line connected to a program inhibited cell).

The page buffers (PB0~PBn-1) of the present invention determine whether or not a precharge voltage is increased, depending on data loaded in an adjacent page buffer during a program operation. For example, when a program data ('0' data) is loaded in an adjacent page buffer and a program inhibited data ('1' data) is to be loaded in a page buffer, the page buffer applies a precharge voltage increased to a predetermined level to a corresponding bit line. The page buffer applies a normal precharge voltage to a corresponding bit line except in the above case.

The high voltage generator and control logic 150 generates high voltages required for each operation in response to inputted control signals (CTRL, for example, CE, RE, CLE, ALE, WP) and controls all operations of inner blocks of the nonvolatile memory device 100.

The nonvolatile memory device 100 according to the present invention determines whether or not a precharge voltage is increased, depending on data loaded in an adjacent page buffer during a program operation. Accordingly, program disturbance is reduced as much as the increased precharge voltage. Here, the program disturbance is that program inhibited cells connected to bit lines adjacent to a program cell are programmed by a program voltage applied to a selected word line.

Figure 2:
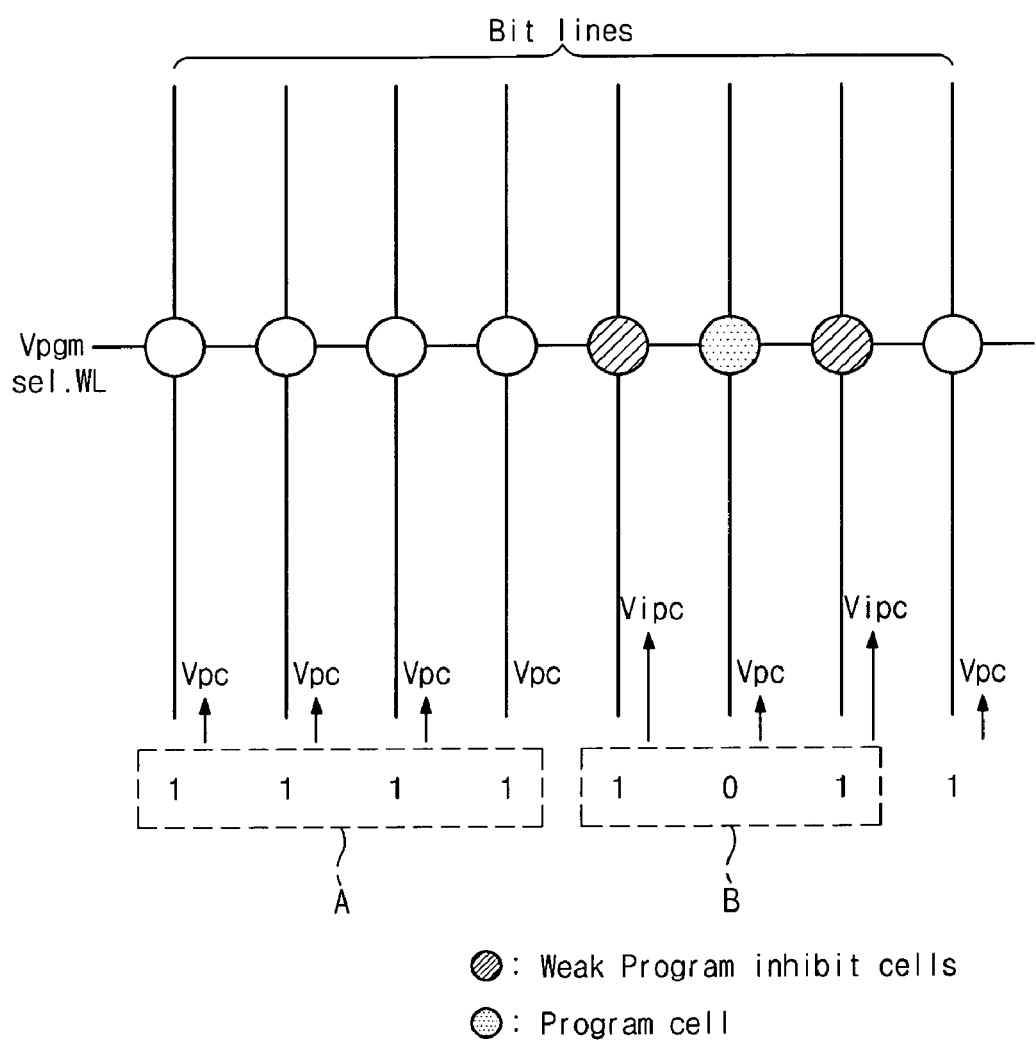
FIG. 2 is a drawing illustrating a reason to increase a precharge voltage so as to reduce a program disturbance.

FIG. 2 is a drawing illustrating a reason to increase a precharge voltage so as to reduce program disturbance. Referring to FIG. 2, a program disturbance may easily occur in a 'B' data state in which data loaded in adjacent page buffers are different from each other, in contrast with the illustrated 'A' data state in which data loaded in adjacent page buffers are uniform. That is, in a 'B' data state, program inhibited cells adjacent to a program cell are easily programmed. In the present invention, an increased precharge voltage (Vipc) is applied to a bit line connected to a program inhibited cell that can easily program disturbed and a precharge voltage (Vpc) is applied to the other bit lines. Here, the increased precharge voltage (Vipc) is higher as much as a predetermined level than the precharge voltage (Vpc).

The nonvolatile memory device 100 according to the present invention applies a precharge voltage increased as much as a predetermined level to a channel including a program inhibited cell which is susceptible, i.e., "weak", to program disturbance. As a result, when a program voltage is applied to a selected word line (Sel. WL), program inhibited cells which are susceptible to program disturbance obtain a program inhibition effect as much as the increased level of the precharge voltage.

In the present invention, the increased precharge voltage can be applied to the program inhibited cells which are susceptible to a program disturbance using various methods. A method of increasing a precharge voltage applied to a bit line by a boosting operation using a coupling effect between a bit line and a bit line will be described.

Figure 3:
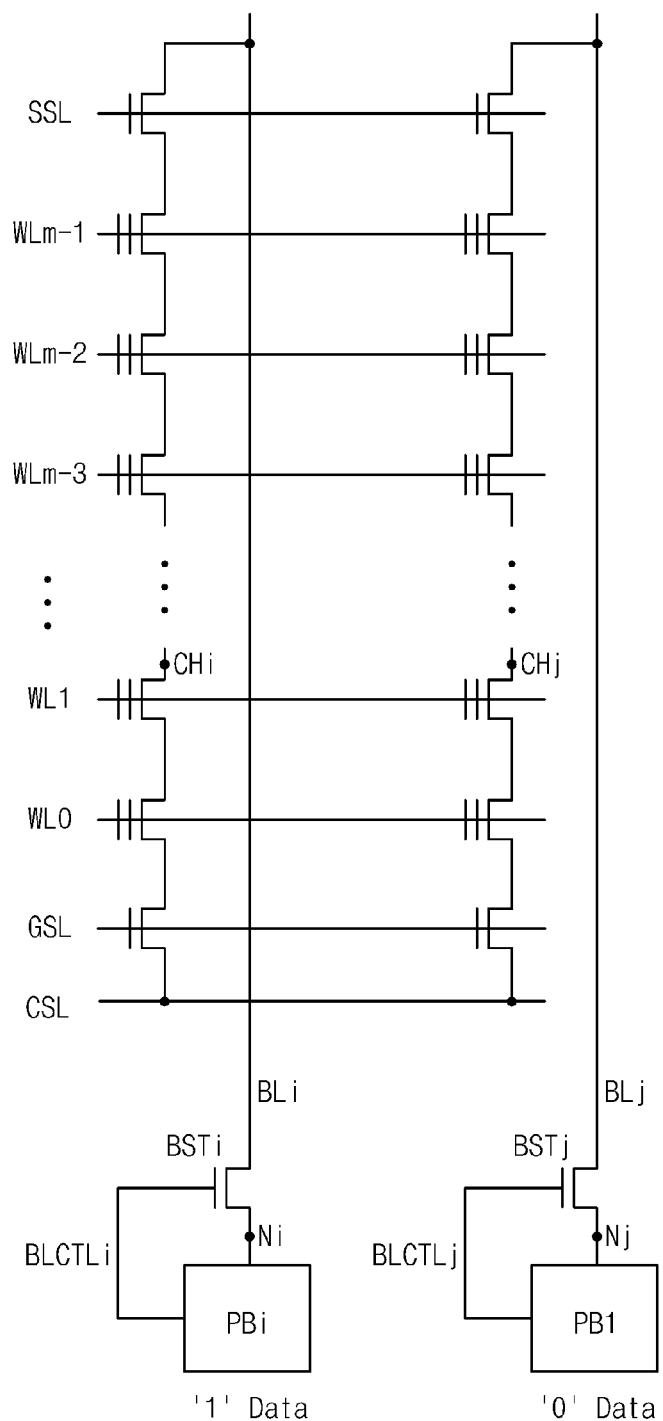
FIG. 3 is a drawing illustrating a method of increasing a precharge voltage in the nonvolatile memory device depicted in FIG. 1.

FIG. 3 is a drawing illustrating a method of applying an increased precharge voltage to a bit line connected to program inhibited cells which are susceptible to program disturbance in the nonvolatile memory device 100 depicted in FIG. 1. Referring to FIG. 3, data '1' and data '0' are loaded in adjacent two page buffers (PBi, PBj) respectively. Here, it is assumed, for example, that data '1" corresponds to a program inhibited cell and data '0' corresponds to a program cell.

The bit line select transistor (BSTi) includes a drain connected to a bit line, a source connected to a node (Ni) and a gate receiving a control signal (BLCTLi) of the page buffer (PBi). Also, the bit line select transistor (BSTj) includes a drain connected to a bit line, a source connected to a node (Nj) and a gate receiving a control signal (BLCTLj) of the page buffer (PBj). The page buffers (PBi, PBj) generate the bit line control signals (BLCTLi, BLCTLj) respectively using a loaded data and data loaded in an adjacent page buffer.

Figure 4:
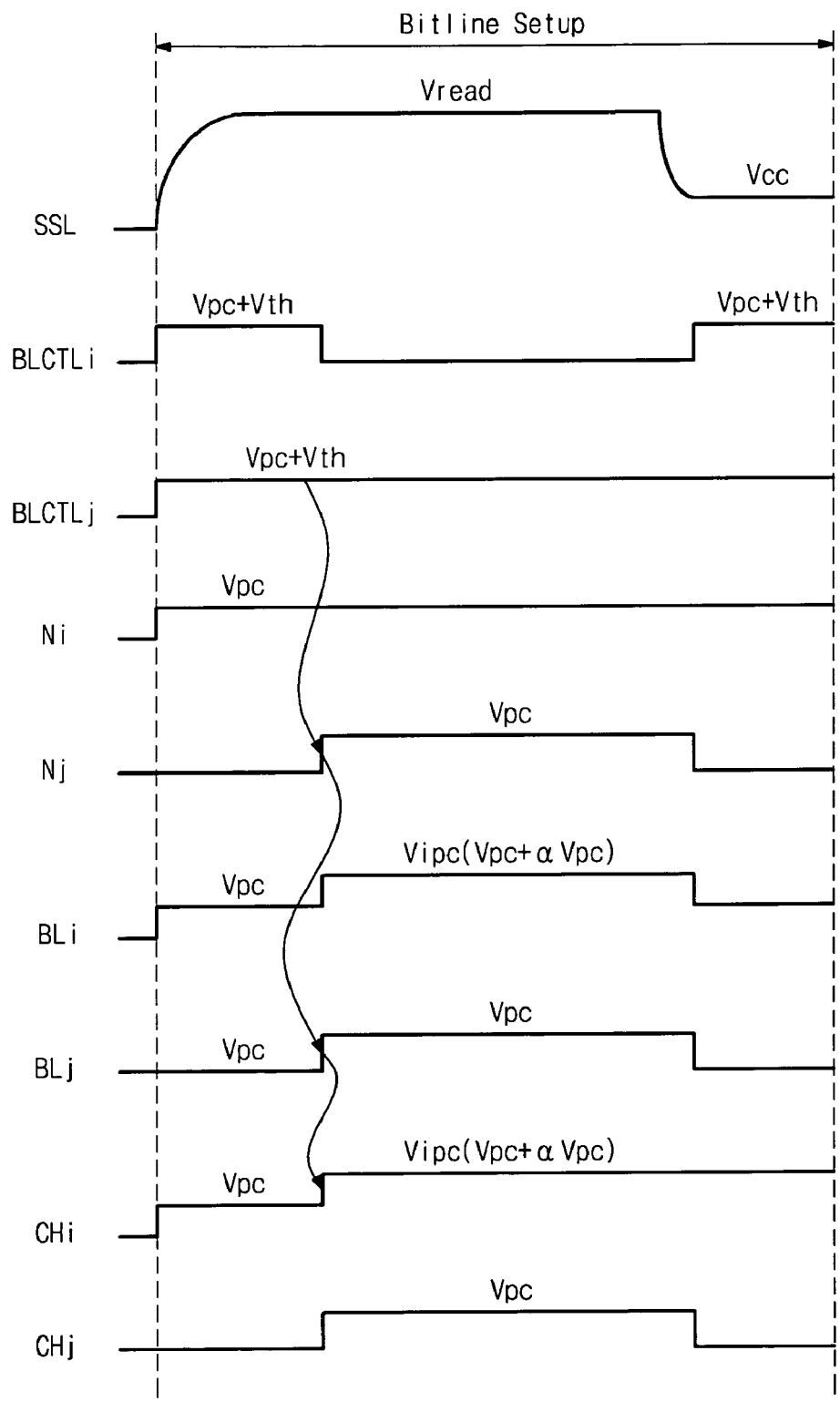
FIG. 4 is a timing diagram illustrating a method of increasing a precharge voltage when setting up a bit line of the nonvolatile memory device depicted in FIG. 3.

FIG. 4 is a timing diagram illustrating a method of increasing a precharge voltage when setting up a bit line of the nonvolatile memory device depicted in FIG. 3. Referring to FIGS. 3 and 4, a method of increasing a precharge voltage in a bit line setup period is in accordance with the following.

A first page buffer (PBi) is in a state in which data '1' is loaded and a second page buffer (PBj) is in a state in which data '0' is loaded. After a select voltage (Vread) is applied to the string select line (SSL) for a predetermined time, a power supply voltage (Vcc) is applied to the string select line (SSL). Thus, after the string select transistor (SST) is turned on for the predetermined time, the string select transistor (SST) is turned off.

The first page buffer (PBi) applies a precharge voltage (Vpc) corresponding to data '1' from a first node (Ni). Here, the precharge voltage (Vpc) may be a power supply voltage (Vcc) or a voltage higher than the power supply voltage (Vcc). The highest voltage among voltages used in the page buffer may be used as the precharge voltage (Vpc).

A first bit line control signal (BLCTLi) of a voltage (Vpc+Vth) higher as much as a threshold voltage (Vth) than the precharge voltage (Vpc) is applied to a gate of the first bit line control signal (BLCTLi) for a predetermined time so as to apply the precharge voltage (Vpc) of the first node (Ni) to a corresponding first bit line (BLi). Here, the threshold voltage (Vth) is a minimum voltage so as to turn on a first bit line select transistor (BSTi). Accordingly, the precharge voltage (Vpc) is applied to the first bit line (BLi).

After that, the first page buffer (PBi) applies the first bit line control signal (BLCTLi) of 0V to a gate of the first bit line select transistor (BSTi) for a predetermined time so that the first bit line (BLi) is placed in a floating state. At this time, the first bit line (BLi) of a floating state is boosted by applying a voltage to an adjacent second bit line (BLj) and as a result, the first bit line (BLi) has a precharge voltage (Vipc=Vpc+αVpc) higher than the precharge voltage (Vpc). Here, the boosting is realized by a capacitor between the first bit line (BLi) and the second bit line (BLj).

The second page buffer (PBj) applies 0V to a second node (Nj) while a precharge voltage (Vpc) is applied to the first bit line (BLi). Also, the second page buffer (PBj) applies a second bit line control signal (BLCTLj) of a voltage (Vpc+Vth) higher as much as a threshold voltage (Vth) than the precharge voltage (Vpc) in a bit line setup period to a gate of a second bit line select transistor (BSTj). Thus, a voltage of the second node (Nj) is applied to a second bit line (BLj) in the bit line setup period. When the first bit line (BLi) is placed in a floating state during a predetermined time, the second page buffer (PBj) applies the precharge voltage (Vpc) to the second node (Nj) for the predetermined time. At this time, the second bit line (BLj) has the precharge voltage (Vpc). Concurrently, the first bit line (BLi) of a floating state is boosted by the precharge voltage (Vpc) applied to the second bit line (BLj) and as a result, the first bit line (BLi) has an increased precharge voltage (Vipc=Vpc+αVpc).

After a precharge voltage of the first bit line (BLi) is increased, the second page buffer (PBj) applies 0V to the second node (Nj) again. Accordingly, the second bit line (BLj) also becomes 0V. This is to program a memory cell connected to the second bit line (BLj) and a selected word line.

A first channel (CHi) is precharged to the increased precharge voltage (Vipc). After that, even though the first channel (CHi) is shut off, the first channel (CHi) maintains the increased precharge voltage (Vipc). In contrast, the second channel (CHj) becomes 0V after increasing the precharge voltage of the first bit line (BLi).

As described above, the nonvolatile memory device 100 according to the present invention increases a precharge voltage of the first channel (CHi) by increasing a precharge voltage of the first bit line (BLi) adjacent to the second bit line (BLj) using a boosting in a bit line setup period.

The nonvolatile memory device 100 according to the present invention performs a normal bit line set up operation in the case in which data state continuously loaded during a program operation is '10' or in all cases ('11', '00') except '01'.

Figure 5:
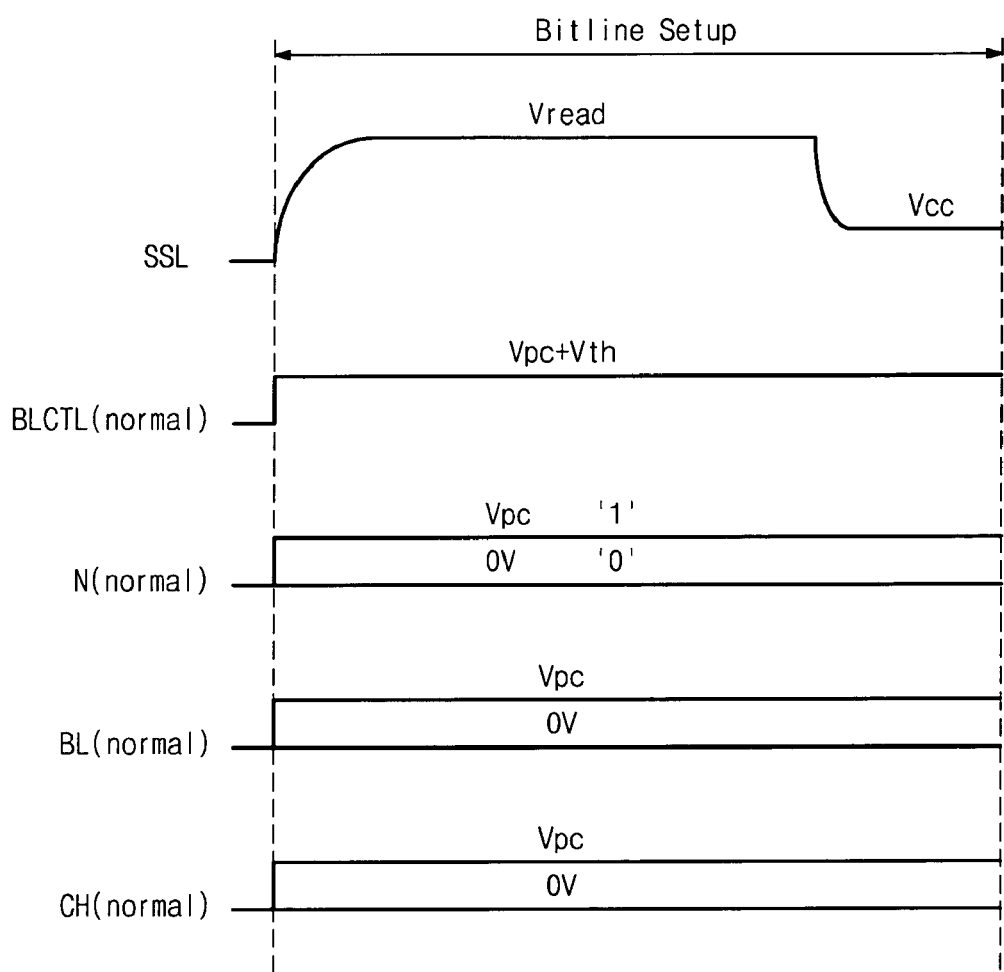
FIG. 5 is a timing diagram of setting up a normal bit line in the nonvolatile memory device of the present invention.

FIG. 5 is a timing diagram of the process of setting up a normal bit line in the nonvolatile memory device 100 of the present invention. Referring to FIGS. 1 through 5, a normal bit line set up operation of the nonvolatile memory device 100 is in accordance with the following. A normal bit line set up operation is performed when data state continuously loaded is '11' or '00'.

A select voltage (Vread) is applied to the string select line (SSL) for a predetermined time so as to turn on string select transistors and a power supply voltage (Vcc) is applied to the string select line (SSL) so as to shut off channels after the predetermined time.

The page buffer circuit 140 applies the precharge voltage (Vpc) or 0V to a node (N) according to a state of a loaded data. For example, if data '1' is loaded, the precharge voltage (Vpc) is applied to the node (N) and if data '0' is loaded, 0V is applied to the node (N). Also, the page buffer circuit 140 generates a control signal (BLCTL) having a voltage (Vpc+Vth) so that a voltage of the node (N) is transmitted to a bit line (BL). Thus, the precharge voltage (Vpc) or 0V is applied to the bit line (BL) according to a corresponding data. Also, a channel (CH) is precharged to the precharge voltage (Vpc) or 0V according to a corresponding data.

In the nonvolatile memory device 100 described in connection with FIGS. 1 through 5, each of the page buffers (PB0~PBn-1) controls an increase of a precharge voltage of a channel according to a state of continuous data. However, the present invention is not limited to that approach. In the present invention, the control logic may control an increase of a precharge voltage of a channel.

Figure 6:
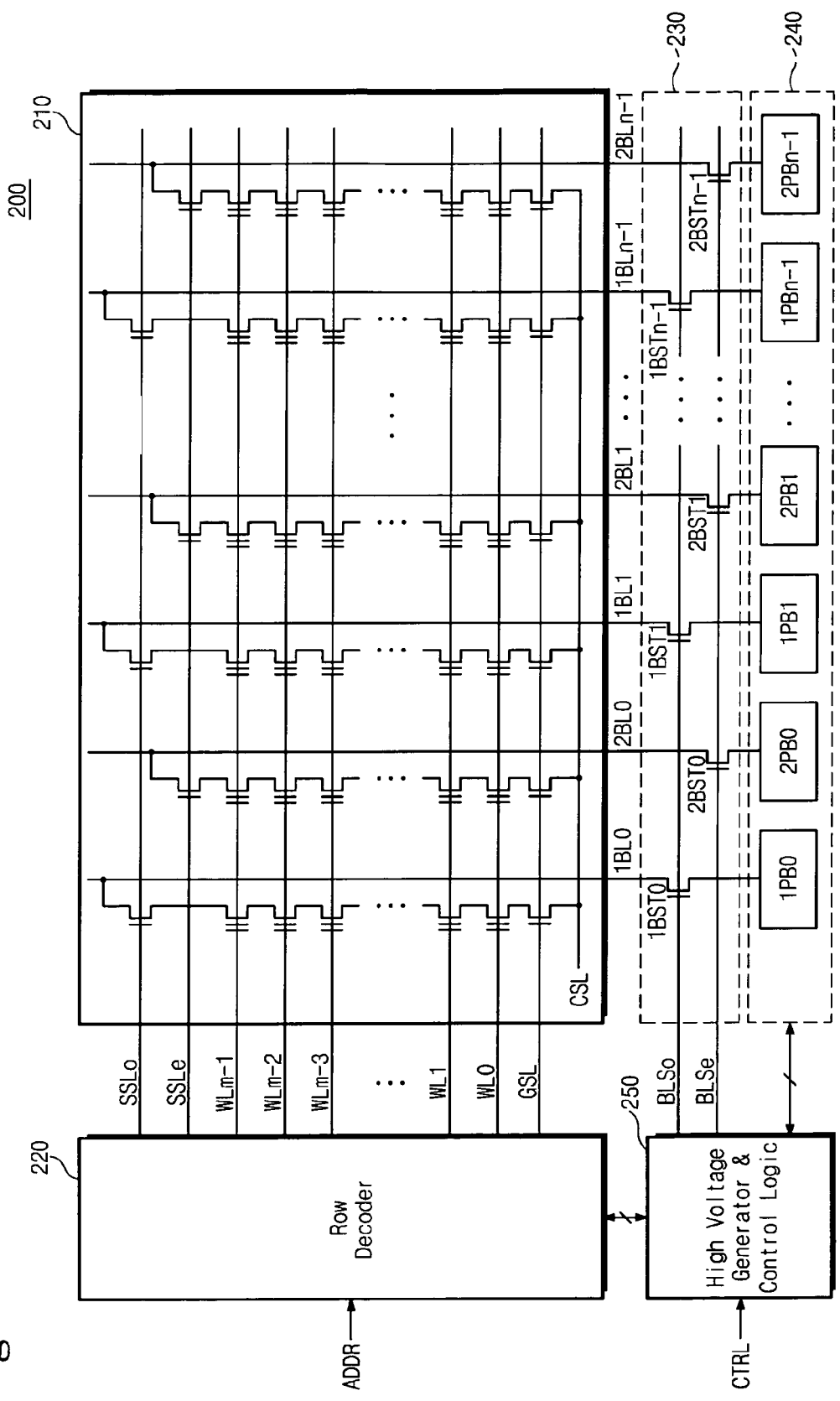
FIG. 6 is a drawing illustrating a second embodiment of a nonvolatile memory device according to the present invention.

FIG. 6 is a drawing illustrating a second embodiment of a nonvolatile memory device 200 according to the present invention. Referring to FIG. 6, a nonvolatile memory device 200 includes a memory cell array 210, a row decoder 220, a bit line select circuit 230, a page buffer 240 and a high voltage generator and control logic 250. The high voltage generator and control logic 250 increases a precharge voltage of selected channels among channels connected to odd-number bit lines (1BL0~1BLn-1) according to a state of loaded data, and then increases a precharge voltage of selected channels among channels connected to even-number bit lines (2BL0~2BLn-1) according to a state of loaded data.

The memory cell array 210 includes a plurality of bit lines (1BL0~1BLn-1, 2BL0~2BLn-1), a plurality of word lines (WL0~WLm-1) and a plurality of memory cells disposed on regions where the bit lines cross the word lines. The memory cell array 210 also includes a plurality of cell strings. As depicted in FIG. 6, a first string select line (SSLo) is connected to gates of string select transistors connecting odd-number strings to odd-number bit lines (1BL0~1BLn-1) and a second string select line (SSLe) is connected to gates of string select transistors connecting even-number strings to even-number bit lines (2BL0~2BLn-1).

The bit line select circuit 230 includes a plurality of odd-number bit line select transistors (1BST0~1BSTn-1) connecting a plurality of odd-number bit lines (1BL0~1BLn-1) to a plurality of odd-number page buffers (1PB0~1PBn-1), respectively, and a plurality of even-number bit line select transistors (2BST0~2BSTn-1) connecting a plurality of even-number bit lines (2BL0~2BLn-1) to a plurality of even-number page buffers (2PB0~2PBn-1) respectively. An odd bit line select line (BLSo) is connected to gates of the plurality of odd-number bit line select transistors (1BST0~1BSTn-1) and an even bit line select line (BLSe) is connected to gates of the plurality of even-number bit line select transistors (2BST0~2BSTn-1). Here, the odd bit line select line (BLSo) receives an odd bit line control signal (BLCTLo) generated from the high voltage generator and control logic 250 and the even bit line select line (BLSe) receives an even bit line control signal (BLCTLe) generated from the high voltage generator and control logic 250. That is, the bit line select circuit 230 is controlled by the high voltage generator and control logic 250.

The high voltage generator and control logic 250 controls the bit line select circuit 230 through the bit line control signals (BLCTLo, BLCTLe) so that bit lines on which a boosting operation is performed becomes a floating state.

The nonvolatile memory device 200 includes the high voltage generator and control logic 250 increasing a channel precharge voltage according to a state of loaded data.

Figure 7:
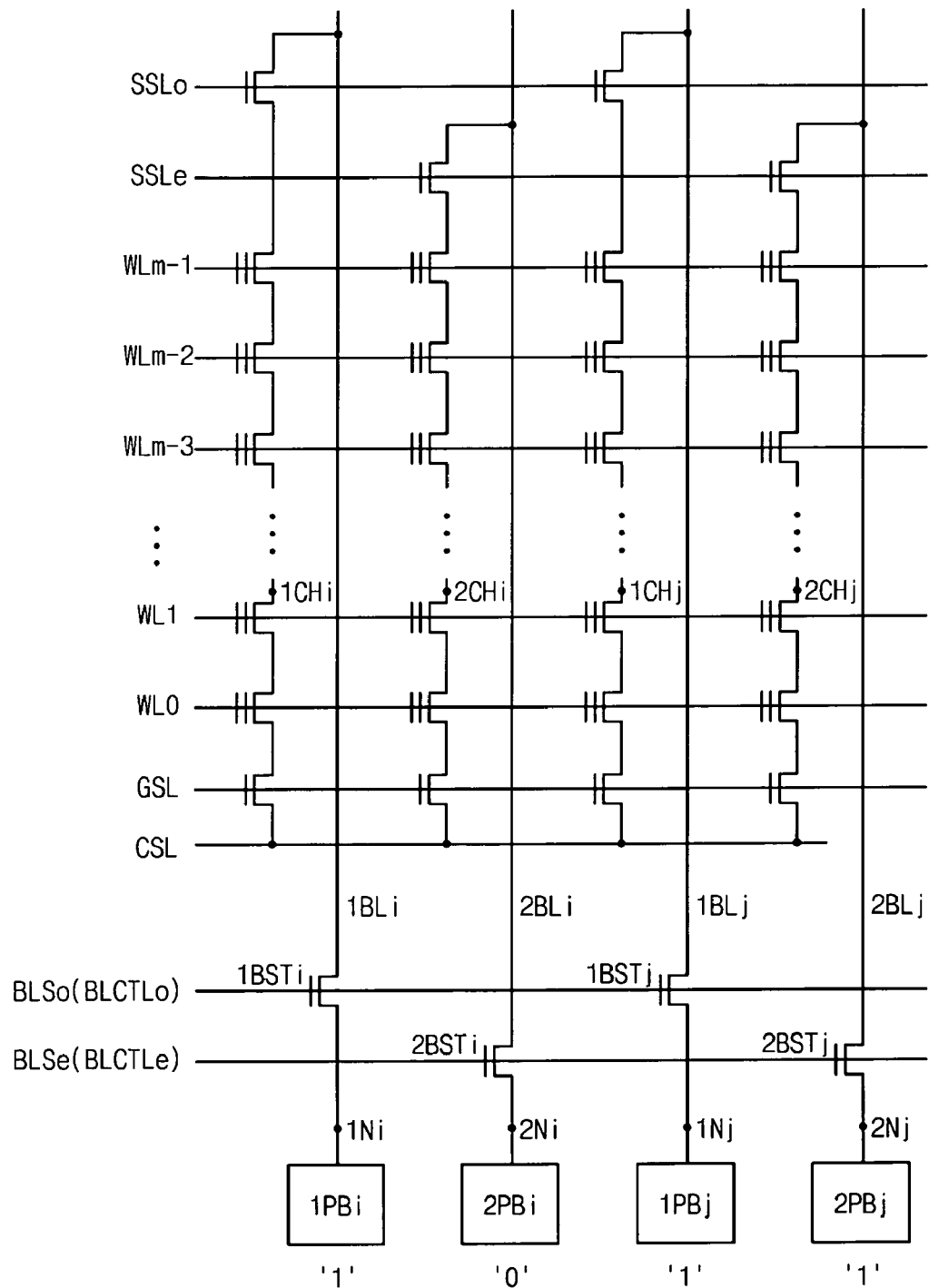
FIG. 7 is a drawing illustrating a method of increasing a precharge voltage in the nonvolatile memory device depicted in FIG. 6.

FIG. 7 is a drawing illustrating a method of increasing a precharge voltage in the nonvolatile memory device 200 depicted in FIG. 6. For convenience, it is assumed, for example, that data '1' is loaded in a first odd page buffer (1PBi), data '0' is loaded in a first even page buffer (2PBi), data '1' is loaded in a second odd page buffer (1PBj) and data '1' is loaded in a second even page buffer (2PBj).

Figure 8:
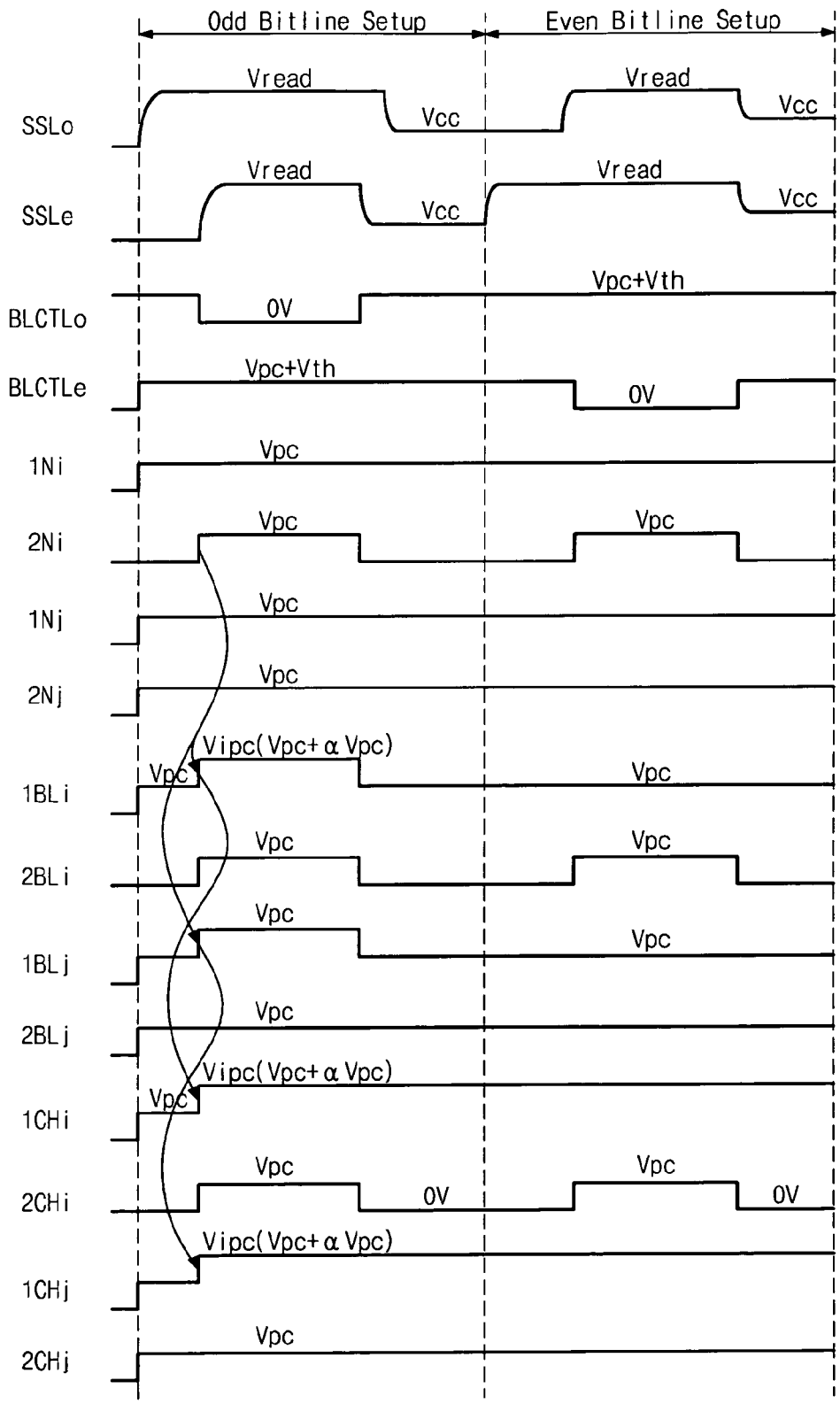
FIG. 8 is a timing diagram illustrating a method of increasing a precharge voltage when setting up a bit line of the nonvolatile memory device depicted in FIG. 7.

FIG. 8 is a timing diagram illustrating a method of increasing a precharge voltage when setting up a bit line of the nonvolatile memory device depicted in FIG. 7. Referring to FIG. 8, odd-number bit lines (1BLi, 1BLj) in an odd bit line setup period have a precharge voltage (Vipc) increased by a boosting. Thus, odd channels (CHi, CHj) are precharged to the increased precharge voltage (Vipc). Also, an even-number bit line (2BLj) in an even bit line setup period has a precharge voltage (Vpc). Thus, an even channel (2CHj) is precharged to the precharge voltage (Vpc).

A method of applying a channel precharge voltage in the bit line setup period described in FIGS. 6 through 8 is to apply a precharge voltage to even-number bit lines (2BL0~2BLn-1) after applying a precharge voltage to odd-number bit lines (1BL0~1BLn-1). The present invention may be embodied so that a precharge voltage is applied to odd-number bit lines (1BL0~1BLn-1) after applying a precharge voltage to even-number bit lines (2BL0~2BLn-1).

In the present invention described above, a boosting between bit lines is used so as to increase a channel precharge voltage. However, the present invention is not limited to this approach. The present invention can provide an increased precharge voltage directly from the high voltage generator to a bit line to which a memory cell that is susceptible to a program disturbance is connected.

Figure 9:
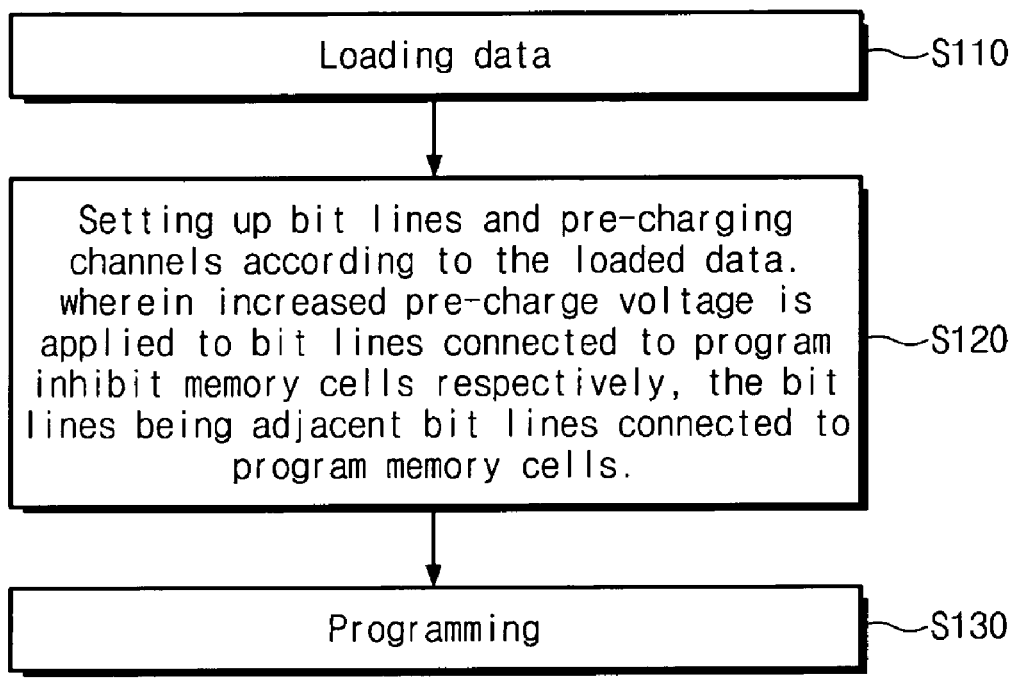
FIG. 9 is a drawing illustrating a method of programming a nonvolatile memory device according to the present invention.

FIG. 9 is a drawing illustrating a method of programming a nonvolatile memory device according to the present invention. Referring to FIG. 9, a programming a nonvolatile memory device is performed in accordance with the following.

Data to be programmed is loaded in a buffer (S110). Bit lines are set up according to the loaded data and corresponding channels are precharged (S120). Here, an increased precharge voltage is applied to bit lines to which program inhibited cells are connected. The program inhibited cells are adjacent to a bit line to which a program cell is connected to be susceptible to a program disturbance. From this, channels in which program inhibited cells are included are precharged to an increased precharge voltage. The program inhibited cells are susceptible to a program disturbance. Here, increasing a precharge of a channel including a program inhibited cell which is susceptible to a program disturbance is performed by the method described in FIGS. 1 through 8. After that, a program voltage is applied to a selected word line and a pass voltage is applied to unselected word lines to perform a program operation (S130). The program operation can be performed by applying a program voltage to a selected word line after applying a pass voltage to all the word lines for a predetermined time. The program method of the present invention can be applied to an incremental step pulse programming (ISPP).

Figure 10:
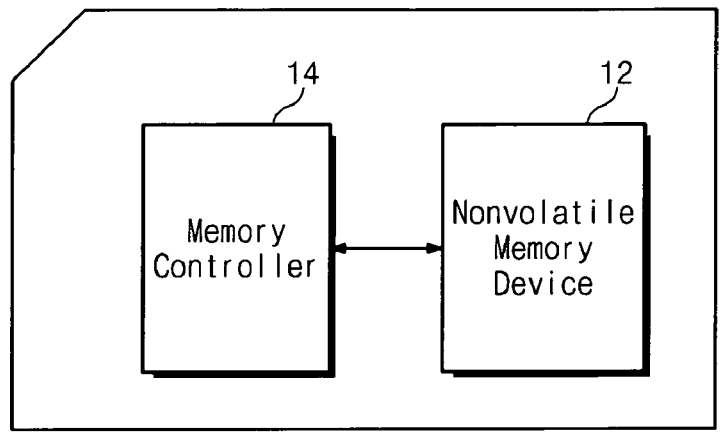
FIG. 10 is a drawing showing a memory card including a memory device according to the present invention.

FIG. 10 is a drawing showing a memory card 10 including a memory device according to the present invention. Referring to FIG. 10, the memory card 10 includes a nonvolatile memory device 12 having a structure substantially identical to a structure of FIG. 1 or FIG. 6 and a memory controller 14 controlling the nonvolatile memory device 12. The memory card 10 is used to store/read data together with digital devices such as a digital camera, a personal digital assistance (PDA), a portable audio device, a cellular phone, a personal computer, or the like.

Figure 11:
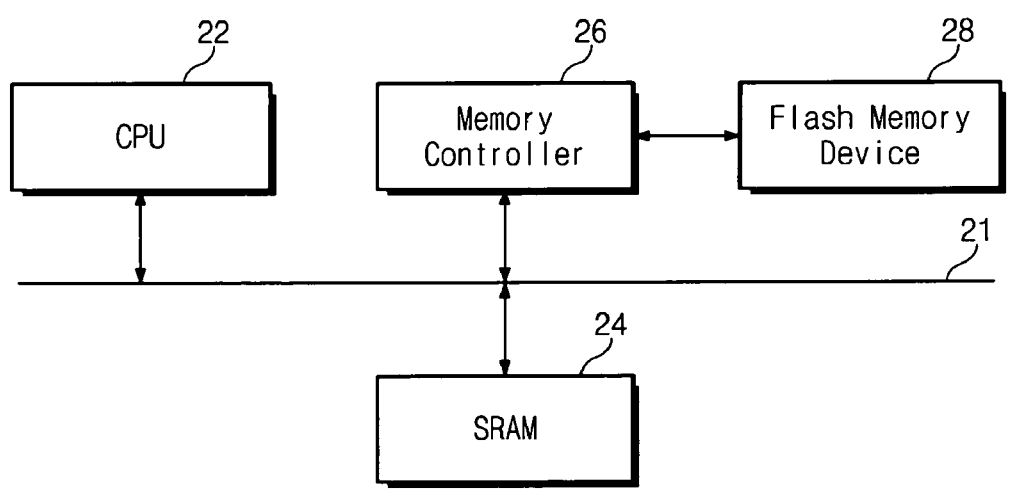
FIG. 11 is a drawing showing a computer system including a nonvolatile memory device according to the present invention.

FIG. 11 is a drawing showing a memory system 20 including a nonvolatile memory device according to the present invention. Referring to FIG. 11, a memory system includes a central processing unit 22 electrically connected to a bus 21, a static random access memory (SRAM) 24, a memory controller 26 and a flash memory device 28. The flash memory device 28 has a structure substantially identical to the structure depicted in FIG. 1. N-bit data (N is a positive number equal to 1 or greater than 1) to be processed by the central processing device 22 is stored in the flash memory device 28 through the memory controller 26.

The memory system 20 may further comprise an application chipset, a camera image processor (CIS), a mobile DRAM or the like. The memory controller 26 and the flash memory device 28 may be comprised of, for example, a solid state drive (SSD) using a nonvolatile memory device to store data.

The flash memory device and/or the memory controller according to the present invention may be mounted using various types of packages. For example, the flash memory device and/or the memory controller according to the present invention may be mounted using packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), wafer-level processed stack package (WSP).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming a nonvolatile memory device comprising:
   precharging bit lines according to data loaded in page buffers;
   charging channels by electrically connecting the precharged bit lines to the channels corresponding to the bit lines respectively; and
   applying a word line voltage for a program after charging the channels, wherein a channel voltage boosting of each of the channels is determined according to data loaded in at least one adjacent page buffer and wherein each of the page buffers determines whether a precharge voltage applied to a corresponding bit line is increased according to the data loaded in the at least one adjacent page buffer.

2. The method of claim 1, wherein when different data are respectively loaded in a first page buffer and a second page buffer adjacent to each other among the page buffers, an increased precharge voltage is applied to one of a first bit line corresponding to the first page buffer and a second bit line corresponding to the second page buffer.

3. The method of claim 2, wherein when data '1' is loaded in the first page buffer and data '0' is loaded in the second page buffer, the increased precharge voltage is applied to the first bit line.

4. The method of claim 2, wherein the increased precharge voltage is a power supply voltage or a voltage higher than the power supply voltage.

5. The method of claim 4, wherein the increased precharge voltage is generated from a high voltage generator and the generated increased precharge voltage is directly applied to the first bit line.

6. The method of claim 4, wherein the increased precharge voltage is obtained from a boosting using a coupling between the first bit line and the second bit line.

7. The method of claim 6, wherein a precharge voltage for the first bit line is applied to the first bit line, the first bit line is floated for a predetermined time and a precharge voltage for the second bit line is applied to the second bit line for the predetermined time so as to obtain the increased precharge voltage.

8. The method of claim 1, wherein applying the word line voltage comprises:
   applying a pass voltage to unselected word lines; and
   applying a program voltage to a selected word line.

9. A method of boosting a channel precharge voltage of a nonvolatile memory device comprising:
   applying a precharge voltage to a first bit line;
   floating the first bit line of the precharge voltage;

boosting the precharge voltage of the first bit line by applying the precharge voltage to a second bit line adjacent to the first bit line when the first bit line is in a floating state; and applying the boosted precharged voltage to a channel by electrically connecting the first bit line to the channel corresponding to the first bit line, wherein a first page buffer corresponding to the first bit line determines whether to boost the precharge voltage of the first bit line according to the data loaded in a second page buffer corresponding the second bit line.

10. The method of claim 9, wherein when a program operation is performed, the first bit line is connected to a program inhibited cell and the second bit line is connected to a program cell.

11. A nonvolatile memory device comprising:
a memory cell array including a plurality of memory cells disposed in regions where a plurality of word lines cross a plurality of bit lines;
a plurality of page buffers temporarily storing data to be programmed to the memory cell array or temporarily storing data read from the memory cell array; and
a bit line select circuit electrically connecting the plurality of bit lines to the plurality of page buffers respectively,
wherein the bit line select circuit comprises a plurality of bit line select transistors having a drain connected to a bit line, a source connected to a page buffer and a gate receiving a bit line control signal, the bit line control signal being generated from the page buffer to control a bit line setup operation.

12. The nonvolatile memory device of claim 11, wherein when different data are respectively loaded in a first page buffer and a second page buffer adjacent to each other among the plurality of page buffers, the first page buffer controls such that a first bit line corresponding to the first page buffer has a first precharge voltage of a floating state for a predetermined time and the second page buffer controls such that a second precharge voltage is applied to a second bit line for the predetermined time when the first bit line becomes the floating state.

13. The nonvolatile memory device of claim 12, wherein the second page buffer controls so that 0V is applied to the second bit line after the second precharge voltage is applied to the second bit line for the predetermined time.

14. The nonvolatile memory device of claim 11, wherein the nonvolatile memory device further comprises a control logic controlling such that an even bit line set up operation is performed on even-number bit lines among the plurality of bit lines after performing an odd bit line set up operation on odd-number bit lines among the plurality of bit lines.

15. The nonvolatile memory device of claim 14, wherein whether a precharge voltage of a bit line is increased according to a state of data loaded in at least one adjacent page buffer when the odd bit line set up operation or the even bit line set up operation is performed.

16. The nonvolatile memory device of claim 14, wherein the control logic controls such that an increased precharge voltage is applied to a bit line corresponding to a page buffer in which data '1' is loaded when the odd bit line set up operation and the even bit line set up operation are performed and data '0' is loaded in a page buffer adjacent to the page buffer in which data '1' is loaded.

17. The nonvolatile memory device of claim 16, wherein the nonvolatile memory device further comprises a high voltage generator applying the increased precharge voltage.

18. A memory system comprising:
a nonvolatile memory device; and
a memory controller controlling the nonvolatile memory device, wherein the nonvolatile memory device precharges bit lines according to data loaded in page buffers, charges channels by electrically connecting the precharged bit lines to the channels corresponding to the respective bit lines and applies a word line voltage for a program after charging the channels, wherein a channel voltage boosting of each of the channels is determined according to data loaded in at least one adjacent page buffer and wherein each of the page buffers determines whether a precharge voltage applied to a corresponding bit line is increased according to the data loaded in the at least one adjacent page buffer.

* * * * *